(12) United States Patent
White et al.

(10) Patent No.: US 7,260,890 B2
(45) Date of Patent: Aug. 28, 2007

(54) METHODS FOR FABRICATING THREE-DIMENSIONAL ALL ORGANIC INTERCONNECT STRUCTURES

(75) Inventors: George E. White, Marietta, GA (US); Madhavan Swaminathan, Marietta, GA (US); Venkatesh Sundaram, Norcross, GA (US); Sidharth Dalmia, Alpharetta, GA (US)

(73) Assignee: Georgia Tech Research Corporation, Atlanta, GA (US)

( * ) Notice: Subject to any disclaimer, the term of this patent is extended or adjusted under 35 U.S.C. 154(b) by 134 days.

(21) Appl. No.: 10/402,315

(22) Filed: Mar. 28, 2003

(65) Prior Publication Data

US 2004/0000425 A1    Jan. 1, 2004

Related U.S. Application Data

(60) Provisional application No. 60/391,742, filed on Jun. 26, 2002.

(51) Int. Cl.
*H05K 3/36*    (2006.01)
(52) U.S. Cl. .............................. 29/830; 29/843; 29/848; 228/180.1; 228/180.21
(58) Field of Classification Search ................ 29/830, 29/825, 842, 843, 846; 228/180.1, 180.21, 228/215; 174/262–266
See application file for complete search history.

(56) References Cited

U.S. PATENT DOCUMENTS 4,745,215 A * 5/1988 Cox et al. .................. 560/301
4,824,381 A * 4/1989 Hertzberg et al. ............ 439/87
5,106,461 A    4/1992 Volfson et al.
5,162,257 A    11/1992 Yung (Continued)

FOREIGN PATENT DOCUMENTS

EP    0 645 952 A1    3/1995

(Continued)

OTHER PUBLICATIONS

Hong, J.S. et al., "Microstrip Filters for RF/Microwave Applications," Wiley-Interscience Publication, 2001, pp. 121-159.

(Continued)

*Primary Examiner*—Jeremy C Norris
(74) *Attorney, Agent, or Firm*—Sutherland Asbill & Brennan LLP

(57) ABSTRACT

The present invention includes methods for making liquid crystalline polymer (LCP) interconnect structures using a high temperature and low temperature single sided liquid crystalline polymer LCP where both the high and low temperature LCP are drilled to form a z-axis connection. The single sided conductive layer is a bus layer to form z axis conductive stud within the high and low temperature LCP, followed by a metallic capping layer of the stud that serves as the bonding metal between the conductive interconnects to form the z-axis connection. High and low temperature LCP layers are etched or built up to form circuit patterns and subsequently bonded together to form final multilayer circuit pattern where the low temperature LCP melts to form both dielectric to dielectric bond to high temperature LCP circuit layer, and dielectric to conductive bond, whereas metal to metal bonding occurs with high temperature metal capping layer bonding to conductive metal layer.

19 Claims, 8 Drawing Sheets

U.S. PATENT DOCUMENTS

| | | | |
|---|---|---|---|
| 5,247,377 A | 9/1993 | Omeis et al. | |
| 5,270,493 A | 12/1993 | Inoue et al. | |
| 5,323,128 A | 6/1994 | Ishizaki et al. | |
| 5,329,695 A * | 7/1994 | Traskos et al. | 29/830 |
| 5,349,314 A | 9/1994 | Shimizu et al. | |
| 5,373,271 A | 12/1994 | Hirai et al. | |
| 5,384,434 A | 1/1995 | Mandai et al. | |
| 5,396,201 A | 3/1995 | Ishizaki et al. | |
| 5,401,913 A * | 3/1995 | Gerber et al. | 174/264 |
| 5,416,454 A | 5/1995 | McVeety | |
| 5,450,290 A * | 9/1995 | Boyko et al. | 361/792 |
| 5,497,337 A | 3/1996 | Ponnapalli et al. | |
| 5,517,751 A | 5/1996 | Bross et al. | |
| 5,521,564 A | 5/1996 | Kaneko et al. | |
| 5,532,667 A | 7/1996 | Haertling et al. | |
| 5,545,916 A | 8/1996 | Koullias | |
| 5,559,360 A | 9/1996 | Chiu et al. | |
| 5,610,433 A | 3/1997 | Merrill et al. | |
| 5,635,892 A | 6/1997 | Ashby et al. | |
| 5,654,681 A | 8/1997 | Ishizaki et al. | |
| 5,668,511 A | 9/1997 | Furutani et al. | |
| 5,679,414 A | 10/1997 | Akashi et al. | |
| 5,703,544 A | 12/1997 | Hays III | |
| 5,716,663 A | 2/1998 | Capote et al. | |
| 5,719,354 A | 2/1998 | Jester et al. | |
| 5,719,539 A | 2/1998 | Ishizaki et al. | |
| 5,720,898 A | 2/1998 | Nohira et al. | |
| 5,739,193 A | 4/1998 | Walpita et al. | |
| 5,770,986 A | 6/1998 | Tonegawa et al. | |
| 5,801,100 A | 9/1998 | Lee et al. | |
| 5,818,313 A | 10/1998 | Estes et al. | |
| 5,844,299 A | 12/1998 | Merrill et al. | |
| 5,917,244 A | 6/1999 | Lee et al. | |
| 5,955,931 A | 9/1999 | Kaneko et al. | |
| 5,999,243 A | 12/1999 | Kameyama et al. | |
| 6,005,197 A | 12/1999 | Kola et al. | |
| 6,008,102 A | 12/1999 | Alford et al. | |
| 6,021,050 A | 2/2000 | Ehman et al. | |
| 6,026,286 A | 2/2000 | Long | |
| 6,031,727 A | 2/2000 | Duesman et al. | |
| 6,040,226 A | 3/2000 | Wojnarowski et al. | |
| 6,051,289 A | 4/2000 | Tsujimoto et al. | |
| 6,079,100 A * | 6/2000 | Farquhar et al. | 29/852 |
| 6,093,599 A | 7/2000 | Lee et al. | |
| 6,114,925 A | 9/2000 | Lo | |
| 6,127,905 A | 10/2000 | Horie | |
| 6,153,290 A | 11/2000 | Sunahara | |
| 6,166,799 A | 12/2000 | Kameyama et al. | |
| 6,171,716 B1 | 1/2001 | Sasaki et al. | |
| 6,177,853 B1 | 1/2001 | Nagatomi et al. | |
| 6,191,666 B1 | 2/2001 | Sheen | |
| 6,191,669 B1 | 2/2001 | Shigemura | |
| 6,225,696 B1 | 5/2001 | Hathaway et al. | |
| 6,249,962 B1 | 6/2001 | Bergstedt | |
| 6,255,714 B1 | 7/2001 | Kossives et al. | |
| 6,259,037 B1 | 7/2001 | Feilchenfeld et al. | |
| 6,259,148 B1 | 7/2001 | Bartush et al. | |
| 6,261,872 B1 | 7/2001 | Hathaway et al. | |
| 6,281,430 B1 | 8/2001 | Lupo et al. | |
| 6,287,931 B1 | 9/2001 | Chen | |
| 6,303,423 B1 | 10/2001 | Lin | |
| 6,333,469 B1 * | 12/2001 | Inoue et al. | 174/260 |
| 6,380,608 B1 | 4/2002 | Bentley | |
| 6,395,374 B1 | 5/2002 | McAndrew et al. | |
| 6,421,225 B2 | 7/2002 | Bergstedt | |
| 6,445,266 B1 | 9/2002 | Nagatomi et al. | |
| 6,492,886 B1 | 12/2002 | Kushitani et al. | |
| 6,528,732 B1 | 3/2003 | Okubora et al. | |
| 6,583,687 B2 | 6/2003 | Nosaka | |
| 6,586,686 B1 * | 7/2003 | Enomoto et al. | 174/262 |
| 6,625,037 B2 | 9/2003 | Nakatani et al. | |
| 6,630,630 B1 * | 10/2003 | Maezawa et al. | 174/262 |
| 6,713,162 B2 | 3/2004 | Takaya et al. | |
| 6,759,600 B2 * | 7/2004 | Koyama et al. | 174/262 |
| 2001/0004228 A1 | 6/2001 | Hirai et al. | |
| 2001/0016980 A1 | 8/2001 | Bergstedt | |
| 2001/0050599 A1 | 12/2001 | Maekawa et al. | |
| 2002/0008301 A1 | 1/2002 | Liou et al. | |
| 2002/0048930 A1 | 4/2002 | Lin | |
| 2002/0064701 A1 | 5/2002 | Hand et al. | |
| 2002/0064922 A1 | 5/2002 | Lin | |
| 2002/0074158 A1 | 6/2002 | St. Lawrence et al. | |
| 2002/0076538 A1 | 6/2002 | St. Lawrence et al. | |
| 2002/0081443 A1 | 6/2002 | Connelly et al. | |
| 2002/0157864 A1 * | 10/2002 | Koyama et al. | 174/261 |
| 2002/0158305 A1 | 10/2002 | Dalmia et al. | |
| 2002/0172021 A1 | 11/2002 | Seri et al. | |
| 2002/0195270 A1 | 12/2002 | Okubora et al. | |
| 2004/0034489 A1 | 2/2004 | Ogino et al. | |
| 2004/0113752 A1 * | 6/2004 | Schuster | 338/310 |

FOREIGN PATENT DOCUMENTS

| | | |
|---|---|---|
| EP | 0506476 B1 | 5/1996 |
| EP | 0510971 B1 | 3/1997 |
| EP | 1 235 235 A1 | 8/2002 |
| EP | 1 411 553 A1 | 4/2004 |
| JP | 09 130103 | 10/1995 |
| JP | WO01/97582 A1 | 12/2001 |
| WO | WO 01/95679 | 12/2001 |

OTHER PUBLICATIONS

Son, M.H. et al., Low-Cost Realization of ISM Band Pass Filters Using Integrated Combline Structures, 2000, (4 pages).

Matijasevic, G. et al., "MCM-L Substrates Fabricated Using Patterned TLPS Conductive Composites," 1997 International Conference on Multichip Modules, Apr. 2, 1997, pp. 64-69.

Charles, H.K., "Packaging With Multichip Modules," 1992 IEEE/CHMT Int'l Electronics Manufacturing Technology Symposium, pp. 206-210.

Min, S.H. et al., "Design, Fabrication, Measurement and Modeling of Embedded Inductors in Laminate Technology," ASME International Electronic Packaging Technical Conference and Exhibition, Jul. 8-13, 2001, pp. 1-5.

Dalmia, S. et al., "Modeling RF Passive Circuits Using Coupled Lines and Scalable Models," 2001 Electronic Components and Technology Conference, pp. 816-823.

www.stneasy.org.tmp; Display from INSPEC; Taoka, M., Kanetaka, T., Dec. 4, 2002.

Alvin L.S. Loke, et al., "Evaluation of Copper Penetration in Low-k Polymer Dielectrics by Bias-Temperature Stress," MRS Spring Meeting, Symposium N/O, Paper O4.4, San Francisco, CA, Apr. 7, 1999.

Wang, et al., "A Full-Wave Analysis Model for Uniplanar Circuits with Lumped Elements," IEEE Transactions on Microwave Theory and Techniques, vol. 51, No. 1, Jan. 2003.

www.sbir.gsfc.nasa.gov/SBIR/successes/ss/110text.html; Liquid Crystal Polymers for Printed Wiring Boards.

www.yamaichi.us/yflex.html; Flexible Printed Circuit—YFLEX.

Patent Abstracts of Japan vol. 1995, No. 09, Oct. 31, 1995.

* cited by examiner

METHODS FOR FABRICATING THREE-DIMENSIONAL ALL ORGANIC INTERCONNECT STRUCTURES

CROSS-REFERENCE TO RELATED APPLICATIONS

This application claims benefit of co-pending U.S. Provisional Application No. 60/391,742, filed Jun. 26, 2002, which is entirely incorporated herein by reference. In addition, this application is related to the following co-pending, commonly assigned U.S. applications, each of which is entirely incorporated herein by reference: "Integrated Passive Devices Fabricated Utilizing Multilayer, Organic Laminates" filed Mar. 28, 2003, and accorded application Ser. No. 10/402,313, which issued on May 31, 2005 as U.S. Pat. No. 6,900,708; and "Stand-Alone Organic-Based Passive Devices" filed Mar. 28, 2003, and accorded application Ser. No. 10/405,024, which issued on Jan. 17, 2006 as U.S. Pat. No. 6,987,307.

STATEMENT OF GOVERNMENT INTEREST

The work that led to this invention has been supported in part by a grant from the U.S. Army, Contract No. DAAH01-99-D-R002-0032. Thus, the United States Government may have certain rights to this invention.

BACKGROUND OF THE INVENTION

I. Field of the Invention

The present invention generally relates to three-dimensional all organic structures, and more particularly to three-dimensional organic interconnect structures for use in radio frequency and mixed signal module substrates and multilayer high-speed printed circuit boards.

II. Description of Related Art

Multilayer circuits typically comprise at least one conductive circuit layer bonded or laminated to a dielectric layer. The conductive circuit layer is generally a conductive metal such as copper, and the dielectric layer generally comprises a polymer resin such as epoxy. Depending on the selection of the dielectric layer and its thickness, the circuit can be either stiff or flexible.

Multilayer organic circuits incorporating thin film technologies are typically fabricated by parallel processing using diclad or monoclad layers that are sandwiched between bond ply materials to form a multilayer circuit construction. The number of metal layers can be as few as two and as many as sixty or more. The requirements for multilayer circuits in high density, high performance applications are becoming ever more demanding for high frequency applications. As a result there exists an unresolved need for a low cost multilayer process that can support both high frequency and high density (e.g., fine line and spaces, small via sizes) multilayer circuit constructions.

SUMMARY OF THE INVENTION

The present invention comprises three-dimensional (3-D) multilayer circuit structures and methods of fabricating same wherein the circuit structures comprise uncladded high and low temperature organic material, such as liquid crystalline polymers (LCPs), teflon or polyphenyl ether (PPE) based materials, that have equivalent electrical and mechanical properties but differing melt temperatures, which enable a uniform homogeneous electrical circuit that can support high frequency and high bandwidth applications. The two different melt points allow for the stacking and lamination of individual circuitized layers to form multilayer construction, which when combined with a higher temperature metallic alloy provides for a reliable metal to metal joining that occurs at a temperature slightly above that at which the fusion bonding of the dielectric to dielectric and dielectric to metal occurs. Incorporation of resistive and high k particles or deposition resistive and high k films into or onto the high melt point and/or low melt point organic layers allows for the ability to integrate buried passives structures, (e.g., bias, decoupling and filter elements) in a 3-D multilayer construction.

The incorporation or deposition of the resistive materials into or on the organic layers provides for the ability to form single resistor elements and arrays when combined with a standardized lithographical process for circuit formation. Similarly, the incorporation of high dielectric constant materials or deposition of the same having dielectric constants from 8 to 20,000 provides for single capacitor elements and arrays when combined with standardized lithographical processes for circuit formation. This enables the fabrication of parallel plate capacitors, inter-digitated (comb) capacitors and distributed capacitance layers with capacitance densities well beyond 1 nf/cm$^2$.

The use of uncladded high temperature and low temperature organic layers allow for the fabrication of fine line geometries down to five micron lines and spaces using build up processes that involve depositing a thin metal conductive layer by electroless plating or vacuum deposition, which could be any one of copper, Ni, Au, Pd, Pt. A photoresist is then deposited, lithographically exposed and then developed. A conductor metal layer is then electroplating through the patterned resist, wherein the conductor metal could be any one of Cu, Ni, Au, Pd, or Pt. While the resist is still in place, an adhesive metal is plated on the previous conductor metal layer. The adhesive metal may be any one of a number of high temperature alloys that will bond at temperatures exceeding the softening point of the organic layers. Such alloys may include, AuSn, PdSn, NiSn.

The various layers can be selectively interconnected by small via (also referred to herein as z-axis interconnects or studs) formed in the organic layers at the dimensions down to ten micron using laser or reactive ion etch techniques. Single side copper formation on the underside of the LCP layer serves as a stop during via formation using a laser or mechanical drill. The underside copper also serves as a cathode or bus layer to provide for the formation of the z-axis interconnect or metallic stud to form a 3-D interconnect structure. The studs or z-axis interconnects are formed by electroplating either copper, nickel, gold, silver or similar conductive metal. The use of electroplating allows for solid via stud formation for improved conductivity.

After fabrication of the conductive metal stud within an organic layer, the top of the stud is capped with high melting point metallic alloy that bonds to copper (or other metallic conductor material used) to form 3-D interconnection upon lamination of high temperature and low temperature metallized organic layer, such as an LCP or similar organic material layer.

BRIEF DESCRIPTION OF THE SEVERAL VIEWS OF THE DRAWING(S)

Having thus described the invention in general terms, reference will now be made to the accompanying drawings, which are not necessarily drawn to scale, and wherein:

DETAILED DESCRIPTION

Figure 1A:
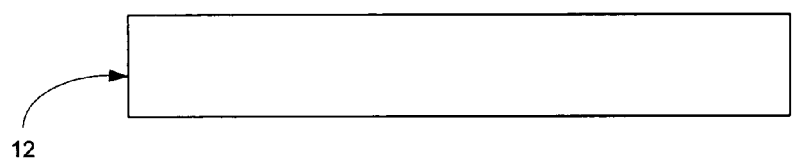
FIGS. 1A-1E are schematic representations of the incremental steps in the fabrication of a multilayer structure in accordance with an embodiment of the present invention.

The present inventions now will be described more fully hereinafter with reference to the accompanying drawings, in which some, but not all embodiments of the invention are shown. Indeed, these inventions may be embodied in many different forms and should not be construed as limited to the embodiments set forth herein; rather, these embodiments are provided so that this disclosure will satisfy applicable legal requirements. Like numbers refer to like elements throughout.

The present invention comprises three-dimensional (3-D) multilayer structures having at least one low temperature organic layer and at least one high temperature organic layer that are processed in a parallel fashion that provides for individual layers to be independently fabricated and tested prior to lamination into a multilayer 3-D circuit. Metal to metal bonding is formed by incorporating a high temperature alloy that melts at a temperature slightly above the fusion point of the low temperature organic layer, but lower in temperature than the high melt point organic layer.

For purposes of the present invention, the organic layer or material may comprise any low cost, high performance organic material, such as polyphenyl ether (PPE) based materials, such as LD621 from Polyclad and N6000 series from Park/Nelco Corporation, Teflon organic from Rogers Corporation, or liquid crystalline polymer (LCP), such as LCP from Rogers Corporation or W.L. Gore & Associates, Inc. These materials provide excellent hermicity and temperature independence, which emulates the performance of ceramic substrates used to construct multilayer ceramic structures.

Advantageously, the construction of the circuits of the present invention does not require an adhesive or lower melting point dielectric to form the 3-D interconnect. As is known to those skilled in the art, adhesives (which are typically epoxies or polyimides) have dissimilar electrical and mechanical properties that are susceptible to moisture uptake, which degrades performance. In addition, the multilayer 3-D circuits of the present invention are homogeneous (e.g., where the two organic materials have the same thickness, dielectric constant, loss tangent, volume resistivity, matching coefficient of thermal expansion (CTE), and modulus) which is highly desirable for improved performance and design ease in high speed digital and high frequency RF/wireless applications both from an electrical standpoint and mechanical standpoint (e.g., to minimize warpage). From an electrical standpoint, the homogeneous construction provides smoother transitions and signal propogation in the z-axis direction, and facilitates the design of matched impedance networks since the dielectric constant and loss are the same, layer to layer.

The present invention includes the incorporation of high k and resistive particles in the organic layers and/or the deposition of high k and resistive films, which represents additional advantages in design flexibility in realizing RF circuits that require RC, LC, and RLC networks. Thus, filters, couplers, duplexers, baluns, mixers, etc. can be integrally fabricated. Such structures are possible because the host matrix material (e.g., filled LCP) is the same as the insulating low temperature and high temperature dielectrics. The low and/or high temperature LCP layer either can be filled with high k dielectric particles or incorporate a high k deposited thin film, which then can be incorporated into the circuit to form embedded decoupling, bandpass filters, low pass filters, baluns, couplers, etc., and baseband circuits such as capacitors, blocking filters, etc. Incorporation of the high k particles may be achieved by introducing a surfactant onto high k particles, such as Barium titinate, lead magnesium nitrate or titatium dioxide to minimize particle clustering, followed by drying and then subsequent introduction in the organic melt prior to drawing and pressing the cladded organic layer into finished sheets. The resultant high k layers sandwiched between copper sheets or planes can serve as embedded decoupling layers that can be processed in the multilayer stack for noise suppression and other benefits. The amount of high k particle incorporated into the organic layer will determine the resultant dielectric constant values and mechanical integrity. Typical volume fraction will vary from 10% to 50%. Additionally, high k organic layers that are either deposited or filled enable passive components and arrays that can support applications beyond 6 GHz, and are process compatible for the 3-D multilayer build up described herein. This is achieved, at least in part, by lithographically defining the top and bottom conductor layers to form a parallel plate construction. The filled organic as well as the non-filled organic is sandwich between the lithographically defined top and bottom conductor layers.

The present invention also provides for the incorporation of resistive particles in the organic laminates or the deposition of resistive thin films on organic laminates, which enables passive components and arrays that provide for the formation of RC, and RLC networks. The resistive particles may include, for example, carbon, silicon carbide, rhuthenium oxide, copper, silver, or combinations thereof, that can be incorporated into the organic melt up to 50% volume, while resistive thin films could include NiP, TaN, NiCr, NiWP, ZnO, etc. A resistive circuit is completed upon deposition and circuitization of metal contacts to form terminals, thereby forming planar and annular resistors and resistor networks. In addition, resistor networks are formed by plating, sputtering, evaporating or chemical vapor deposition of metals and/or metallic alloys on finished organic laminates to form low and high value resistors and resistor networks upon circuitization of metallic terminals to form planar and annular resistors and resistor networks. The resistor devices or elements can also be fabricated by laminating, electroplating, vacuum deposition, or printing of resistive films on the organic laminates. Upon putting down the resistive film, a metallic layer is deposited on the resistive film and the resistor and/or resistor networks are defined via a print and etch technique. In defining resistors or resistive networks using filled resistive organic layers, the filled organic layers are metallized either by plating, lamination or vacuum deposition. The conductors can then be lithographically defined to form the metallic terminals of the resistors.

The thin film of high k or resistive material can be fabricated on an organic layer using known techniques. For example, a layer of high k material can be deposited by CVD or sputtering and then lithographically defined into a desired design. Likewise, a layer of resistive material can be deposited by evaporation, CVS or sputtering and then lithographically defined. In either case, the thickness of the thin film will vary based upon the desired performance characteristics sought.

A 3-D multilayer circuit in accordance with the present invention can be fabricated in either sequential mode or reel to reel. In a sequential mode, a high temperature uncladded or single sided organic laminate from 1-10 mils in thickness is initially obtained. For the uncladded example, one side is metallized by, for example, sputtering or chemical-electro deposition of a thin conductive film, such as copper, nickel or gold. The other side is then drilled to form a via that terminates at the polymer-metal interface. Upon appropriate surface treatment (e.g., by plasma or chemical etching), the via is then metallized by electroless plating and capped with an adhesive metal, such as gold-tin. The bottom layer, which served as the conductive layer or bus layer, is then circuitized to form a single metal layer circuit. Upon completion of the circuit, other layers (e.g., alternating layers of high and low melting point material) are combined so that 3-D connections are formed by the vias h/l stackup. The layers are stacked in a lamination press, whose temperature and pressure conditions will vary due to a number of known factors, such as the number of layers and the adhesive metal composition. As an example, the layers may be laminated together in a press applying 75-500 psi at 270-280° C. for 5-20 minutes. Within this stack could be one or more high k dielectric layers and resistive layers. The stack is taken up in temperature and pressure and laminated to fuse the low temperature dielectric to the high temperature dielectric, the low temperature dielectric to the metal, and the metal alloy to the trace metal on the organic layer.

The 3-D metal layer circuit can also be processed onto an expansion matched CTE (coefficient of thermal expansion) core or substrate. The core material and the dielectric material can be tailored to have the same thermal expansivity, which provides for little to no warpage for improved reliability. In addition, the CTE match of core and dielectric can be tailored to that of silicon devices, which can be subsequently joined to the 3-D interconnect in the absence of underfill.

ILLUSTRATIVE EMBODIMENTS

The following is an illustrative embodiment of a method of fabricating a multilayer organic structure according to the present invention utilizing LCP as the organic material, followed by several alternative embodiments.

FIG. 1A is a schematic representation of an uncladded high temperature or low temperature LCP dielectric film 12, in accordance with an embodiment of the present invention. In a preferred embodiment, the high and low temperature LCP film has a CTE between 2 and 20 ppm/° C.

Figure 1B:
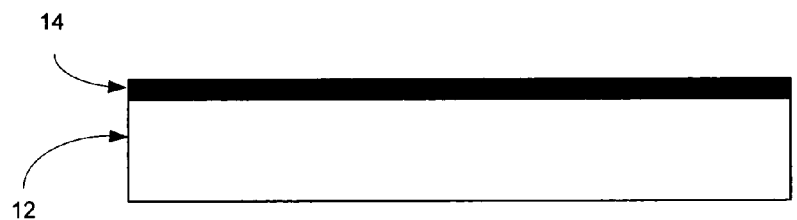

Next, as illustrated in FIG. 1B, a metalized layer 14 has been fabricated on the high temperature or low temperature LCP dielectric film 12, in accordance with an embodiment of the present invention. Metallization of the LCP film 12 can be accomplished by electroless and electroplating, sputtering, evaporation, or chemical vapor deposition. Metallization can be an adhesive metal such as copper, chromium, titanium, or platinum, followed by deposition of either copper, nickel, gold, or palladium. The thickness is preferably between 0.5 microns to 200 microns.

Figure 1C:
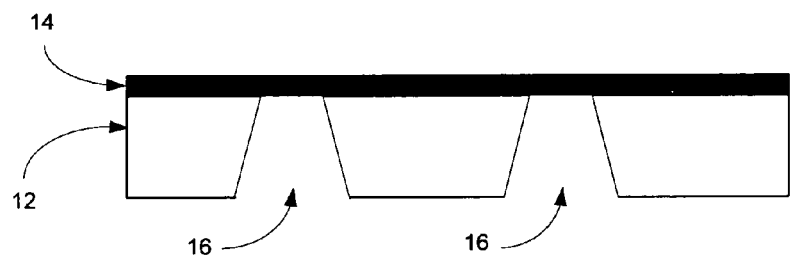

Next, as illustrated in FIG. 1C, the high temperature or low temperature LCP dielectric film 12 that has been drilled either by laser, mechanical, punch, etch, reactive ion etch to form vias 16 down to the underside of the metallization. Suitable lasers include UV, CO2, excinor, or YAG, and the drilling can be accomplished using computer numeric control (CNC) or using a patterned mask for image transfer.

Figure 1D:
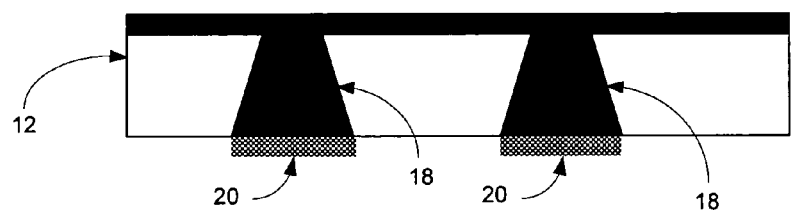

As illustrated in FIG. 1D, the metallized vias 16 have been plated, sputtered, or filled with conductive paste or evaporated, to form a conductive via stud 18 within the via 16, followed by the fabrication of an adhesive capping layer 20, which comprises a high melting point alloy that forms metal to metal joining. The solid via studs 18 form the z-axis interconnect between the layer of the stack up, while the adhesive caps 20 serve to form the reliable metal to interconnect bond. The cap is preferably a metallic solder of a binary alloy that melts at a temperature above that of the fusion point of the high temperature and low temperature LCP layers.

Figure 1E:
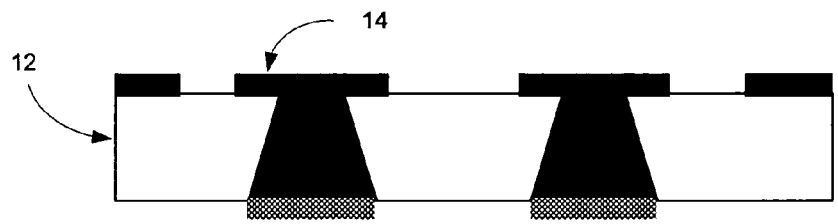

Next, as illustrated in FIG. 1E, the metalized layer 14 fabricated (e.g., printed and etched to form a single sided circuit layer) on either a high temperature or low temperature LCP dielectric film 12 is circuitized (e.g., etched). Circuitization of the LCP sheets can also be accomplished in an additive or semi additive method, where the defined circuit layer is formed by plating through a patterned photoresist. Followed by stripping of the resist and removal of the conductive bus layer used for the electroplating.

Figure 2:
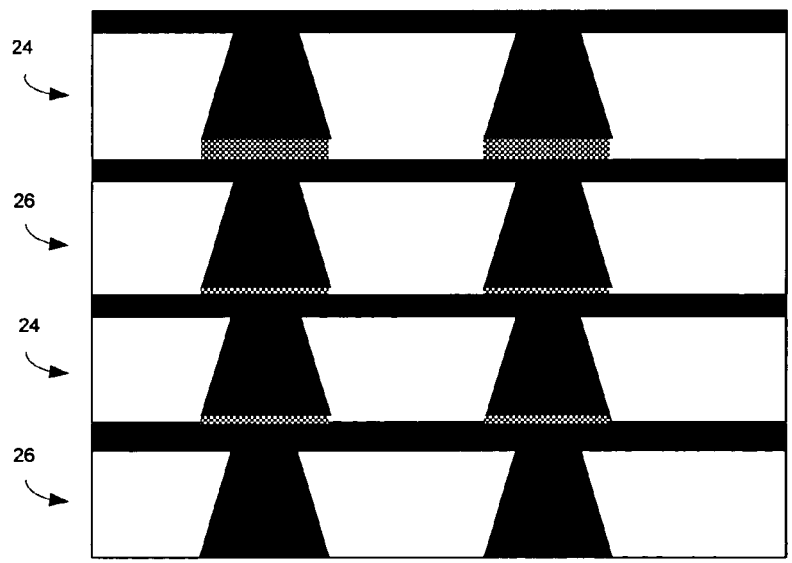
FIG. 2 is a schematic representation of multiple circuitized layers stacked in an alternating sequence of high and low temperature dielectrics.

FIG. 2 is a schematic representation of multiple circuitized layers that have been stacked in an alternating sequences of aligned high temperature circuitized dielectric layers 24 and low temperature circuitized dielectric layers 26, which are fusion bonded at temperatures and pressures sufficient enough to form a multilayer flex circuit construction, in accordance with an embodiment of the present invention.

Figure 3:
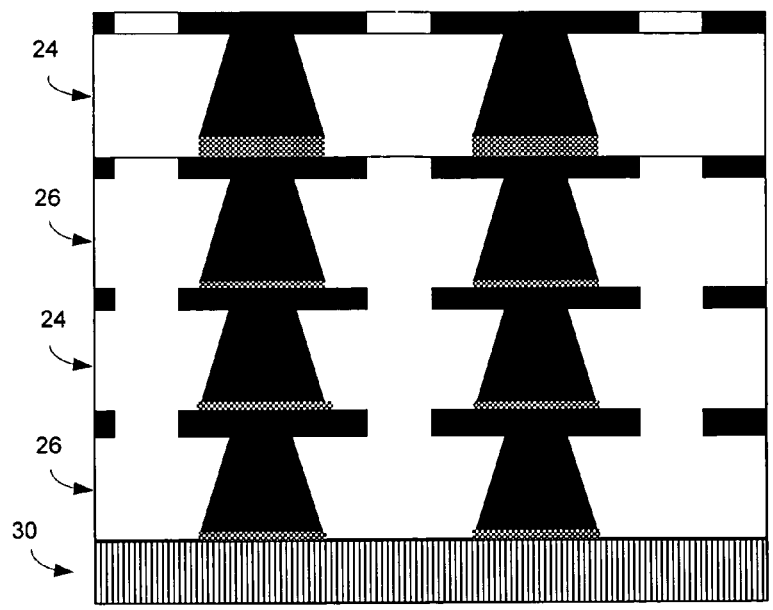
FIG. 3 is a schematic representation of a multilayer circuitized structure including an expansion matched rigidizer embodiment of the present invention.

FIG. 3 is a schematic representation of circuitized layers that have been stacked in alternating sequences of high temperature circuitized dielectric layers 24 and low temperature circuitized dielectric layers 26 with a matched coefficient of thermal expansion (CTE) rigidizer 30, which can be either metallic or other inorganic, and which is fusion bonded to form a multilayer rigid circuit construction. The rigidizer can be disposed above or below the circuitized layers, as shown, or alternatively, the rigidizer can be aligned and placed between circuitized layers, where the circuit layers are stacked on either side of the rigidizer, followed by lamination of the entire stack up to form a multilayer rigidized circuit construction. Depending on the material comprising the rigidizer, it can also serve as a heat sink, ground or power plane, or EMI shielding. Examples of suitable materials include copper-invar-copper (CIC) or aluminum silicon carbide.

Figure 4A:
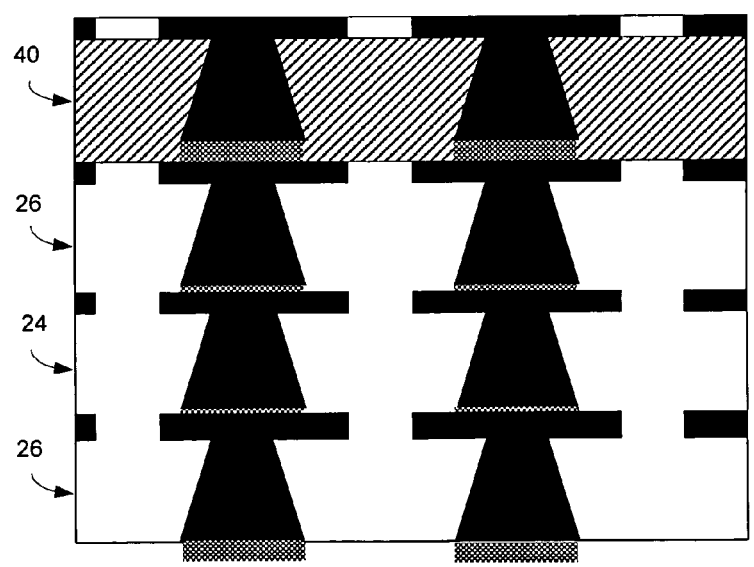
FIGS. 4A and 4B are schematic representations of a multilayer circuitized structure including high k ceramic particles incorporated into an organic layer, or deposited as a film, in accordance with an embodiment of the present invention.
Figure 4B:
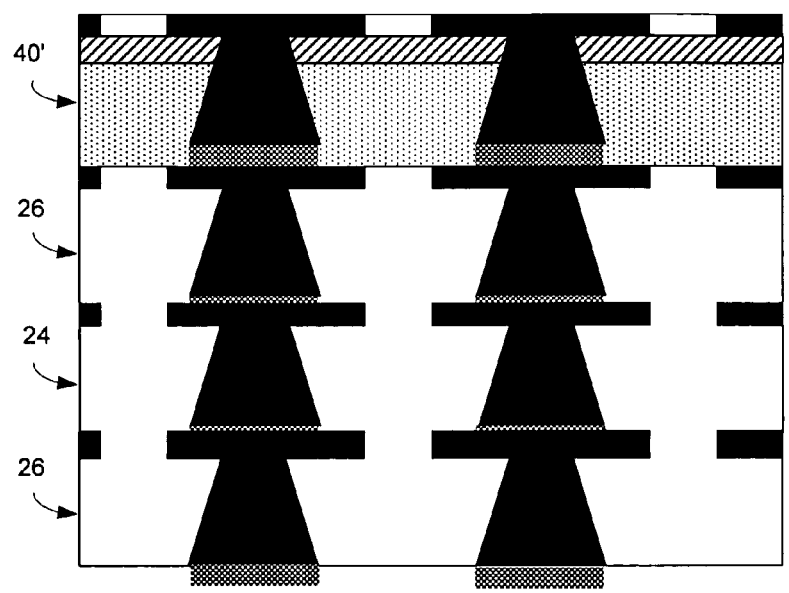

FIG. 4A is a schematic representation of circuitized layers that have been stacked in alternating sequences of high temperature circuitized dielectric layers 24 and low temperature circuitized dielectric layers 26 with an LCP layer 40 filled with high k ceramic particles. Alternatively, a high k film 40' can be deposited on LCP layer, as shown in FIG. 4B. The LCP layer 40 is fusion bonded in the multilayer stackup and circuitized to form a multilayer flex circuit construction with embedded inductors and capacitors in accordance with an embodiment of the present invention.

Figure 5A:
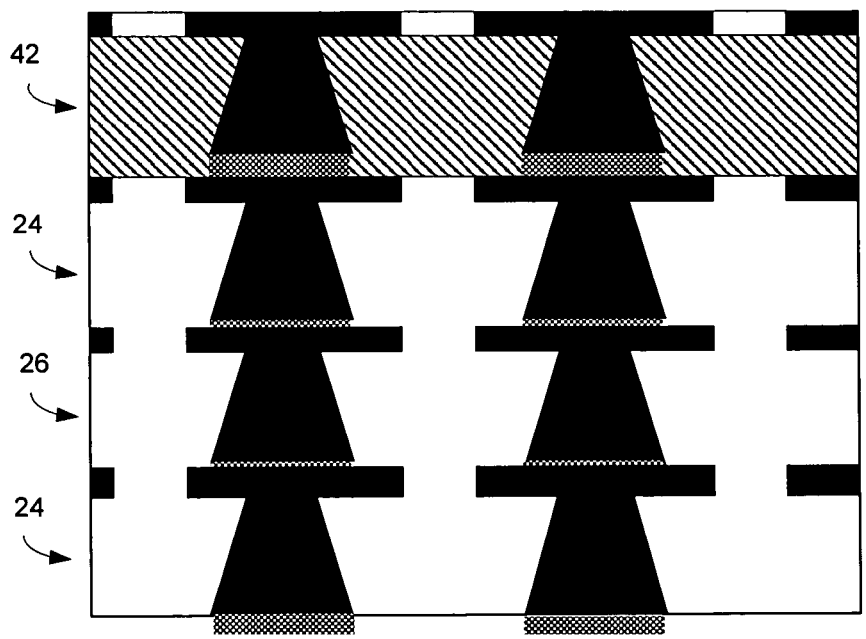
FIGS. 5A and 5B are schematic representations of a multilayer circuitized structure including resistive particles incorporated into an organic layer, or deposited as a resistive film, in accordance with an embodiment of the present invention.
Figure 5B:
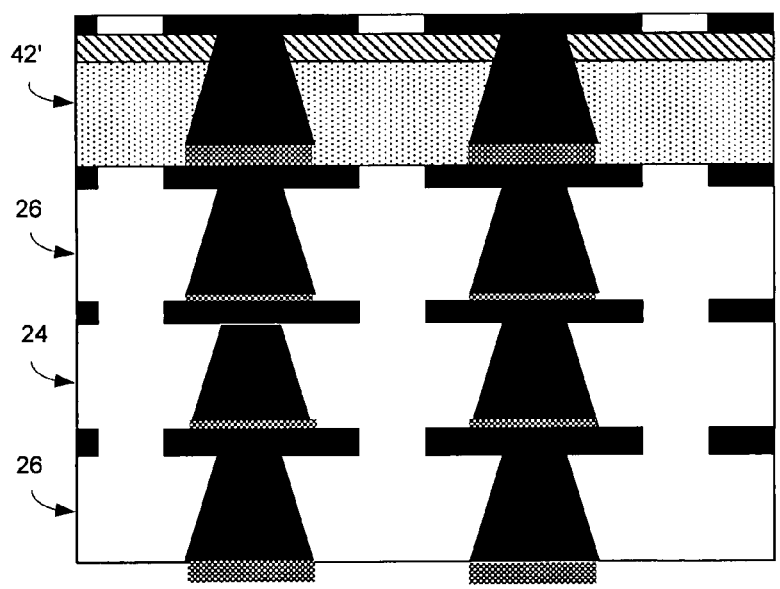

FIG. 5A is a schematic representation of circuitized layers that have been stacked in alternating sequences of high temperature circuitized dielectric layers 24 and low temperature circuitized dielectric layers 26 with an LCP film 42 filled with resistive particles. Alternatively, a resistive films 42' (such as NiCr, TaN, NiP, or NiWP) can be deposited on the LCP layer as illustrated in FIG. 5B. The LCP layer is fusion bonded to form a multilayer flex circuit construction with embedded resistors (R), inductors (L) and capacitors (C).

Figure 6:
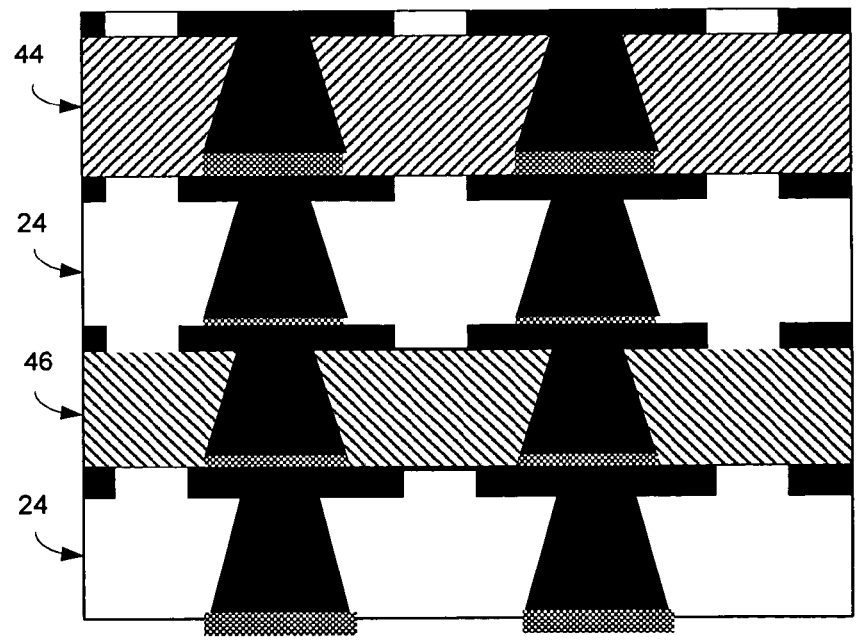
FIG. 6 is a schematic representation of a metalized circuitized structure including high k ceramic particles incorporated into the organic layer or deposited as a film on the organic layer, and a second organic layer including resistive particles incorporated into the second organic layer or deposited as a film on the second organic layer in accordance with an embodiment of the present invention.

FIG. 6 is a schematic representation of circuitized layers that have been stacked in alternating sequences of high temperature circuitized dielectric layers 24 and low temperature circuitized dielectric layers 26 that includes a layer 44 that includes a deposited high k dielectric film or is LCP filled with high k ceramic particles, and in a separate discrete level of the stack, a layer 46 that includes a deposited resistive film 46 or is filled LCP with resistive particles, wherein the stack is fusion bonded to form a multilayer flex circuit construction with embedded R, L and C's.

Figure 7:
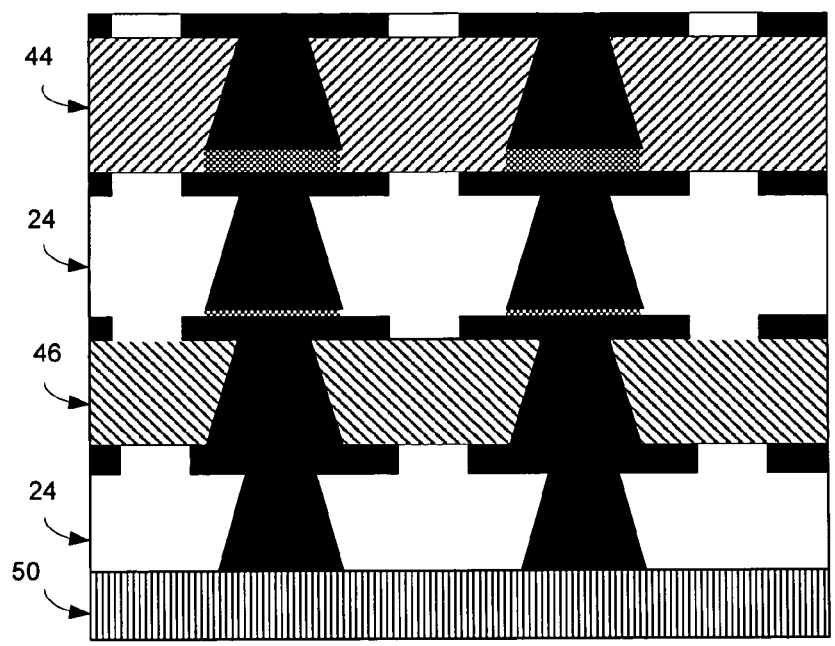
FIG. 7 is a schematic representation of a multilayer circuitized structure including layers filled with high k ceramic and resistive particles and/or films deposited with high k ceramic and resistive particles, and a rigidizer layer in accordance with an embodiment of the present invention.

FIG. 7 is a schematic representation of a rigid multilayer circuit of FIG. 6 with a metallic, inorganic or organic rigidizer 50. The rigidizer 50 can be located on either side of the multilayer circuit stackup or within the multilayer stack up to form a rigid multilayer circuit construction with embedded components such as R, L, and C's. Through vias that are filled with plated copper or conductor paste can be used to connect circuit layers on opposite sides of the rigidizer. The multilayer substrate or module can be used for interconnecting a vast array of active and passive components either through direct attached methods or surface mount technologies.

Figure 8:
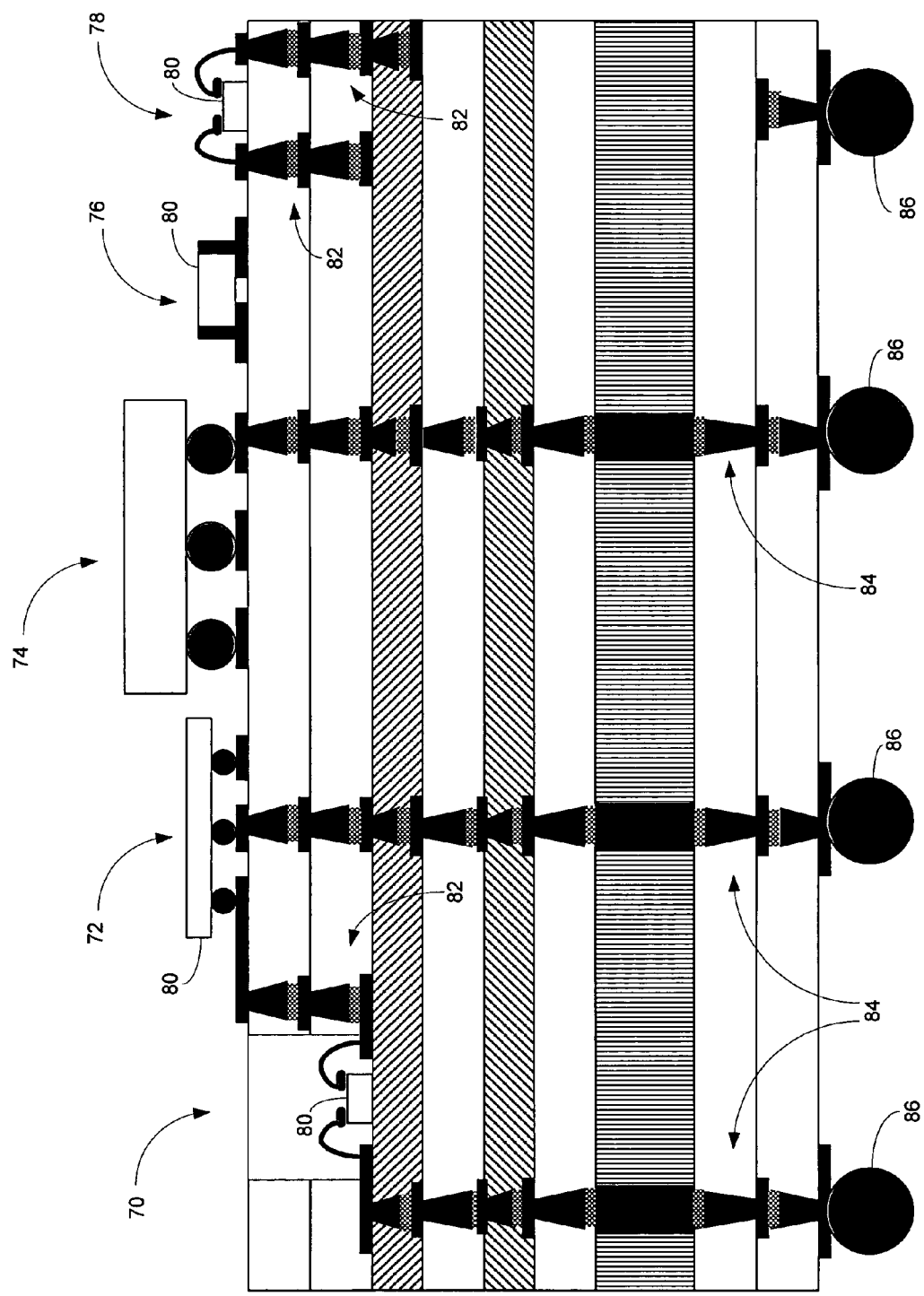
FIG. 8 is a schematic representation of a multilayer circuitized structure illustrating various packaging formats compatible with the present invention.

The multilayer 3D interconnect structure described herein can support the packaging and interconnection of various active and passive components in addition to the passive components embedded in the structure to form functional modules or system boards for digital, RF/wireless, or mixed signal modules. The ability to tailor the expansion of the multilayer circuit, described above, enables the packaging of different active chips such as silicon CMOS, SoI, SiGe, GaAs, and surface mount passive components in a highly reliable platform. For example, FIG. 8 is a schematic representation of a multilayer circuitized structure including various illustrative packaging formats supported by the present invention. Suitable packaging formats include, but are not limited to, flip-chip, wafer level packages (WLP), chip scale packages (CSP), ball grid array (BGA), wire bonded devices and various surface mount devices (SMD or SMT).

The formats illustrated in FIG. 8 include cavity flip chip or wirebond 70, flip chip wafer level packaging 72, BGA/CSP 74, SMD/SMT 76 and wire bond 78. The chips and/or package components 80 can be attached on a top surface of the multilayer circuit or within cavities formed inside the multilayer circuit using routing, punching, laser machining or other standard processes known to those skilled in the art. These cavities can be single level or multilevel and can be interconnected to other circuit layers using microvias or plated through holes. Using microvias 82 and plated through holes 84, the packaged components 80 on the top side of the module or in cavities can be interconnected to each other, to the embedded passive layers that include capacitors, inductors, resistors, etc., or to the BGA pads 80 on the bottom side of the module. The side walls of the module substrate can be covered with conductor like Cu, Ni, Au or other absorbing materials to provide shielding from EMI and other external radiation. This shielding can be formed with electroless and electroplating, vacuum deposition, lamination or other deposition methods known to those skilled in the art. The assembled multilayer module substrate can form a system board for a system or can be terminated with ball grid array on the bottom side or wirebonded from the top side for further interconnection to other components on a system board.

Many modifications and other embodiments of the inventions set forth herein will come to mind to one skilled in the art to which these inventions pertain having the benefit of the teachings presented in the foregoing descriptions and the associated drawings. Therefore, it is to be understood that the inventions are not to be limited to the specific embodiments disclosed and that modifications and other embodiments are intended to be included within the scope of the appended claims. Although specific terms are employed herein, they are used in a generic and descriptive sense only and not for purposes of limitation.

The invention claimed is:

1. A method of fabricating 3-D multilayer interconnect structures, comprising;
providing a first organic layer of a first melting point having a first single sided circuitized conductive layer;
providing a second organic layer of a second melting point having a second single sided circuitized conductive layer and including at least one metal filled z-axis via connection stud, wherein the first and second melting points are different;
capping the z-axis stud of the second organic layer with a high temperature bonding material; and
bonding the first organic layer to the second organic layer;
wherein the first organic layer having the first single-sided circuitized conductive layer and the second organic layer having the second single-sided circuitized layer are provided prior to the step of bonding,
wherein the first organic layer forms a fusion bond with the second organic layer, and the cap on the second organic layer forms a metal to metal bond with the first conductive layer, and wherein the first and second organic layers remain substantially the same prior to and subsequent to the step of bonding.

2. The method of claim 1, wherein the first or second conductive layer comprises at least one of copper, aluminum, gold, nickel, iron, silver, zinc, chromium and a combination thereof.

3. The method of claim 1, wherein at least one conductive layer on one of the first and second organic layers serves as a bus layer prior to the z-axis via stud formation.

4. The method of claim 1, wherein the first melting point is less than the second melting point.

5. The method of claim 1, wherein the first melting point is greater than the second melting point.

6. The method of claim 1, wherein the cap on the vias of the second organic layer is a metallic solder of a binary alloy that melts above a fusion point of the first and second organic layers.

7. The method of claim 1, wherein the first conductive layer has a thickness from approximately 0.5 microns to 200 microns.

8. The method of claim 1, wherein the first and second organic layers are laminated together in a stack to form a three-dimensional (3-D) circuit.

9. The method of claim 8, wherein the 3-D circuit is a flexible circuit.

10. The method of claim 8, wherein the 3-D circuit is a rigid circuit.

11. The method of claim 8, wherein the coefficient of thermal expansion of the completed 3-D circuit in the x and y directions are substantially matched.

12. The method of claim 8, wherein the coefficient of thermal expansion of the first and second organic layers is between 2 and 20 ppm/° C.

13. The method of claim 1, wherein the second organic layer is sufficiently filled with high k dielectric constant particles to achieve a suitable high k film for high value capacitors and resonator structures.

14. The method of claim 1, wherein the second organic layer includes a thin film of high k dielectric constant material.

15. The method of claim 1, wherein the second organic layer is sufficiently filled with resistive particles and circuitized to form a resistor or a resistor network.

16. The method of claim 1, wherein the second organic layer includes a thin film of resistive material.

17. The method of claim 1, further comprising an expansion matched core that is bonded to one of the first or second organic layers to provide expansion matching to one of an organic, ceramic and metal substrates.

18. The method of claim 17, wherein the expansion matched core is metallic, and performs thermal and electrical functions.

19. The method of claim 1, wherein the first and second organic layers are homogenous in electrical and mechanical properties, excluding melting points.

* * * * *